United States Patent
Woodin et al.

(10) Patent No.: US 7,411,219 B2
(45) Date of Patent: Aug. 12, 2008

(54) UNIFORM CONTACT

(75) Inventors: Richard L. Woodin, Austin, TX (US); William F. Seng, Austin, TX (US)

(73) Assignee: Fairchild Semiconductor Corporation, South Portland, ME (US)

( * ) Notice: Subject to any disclaimer, the term of this patent is extended or adjusted under 35 U.S.C. 154(b) by 60 days.

(21) Appl. No.: 11/190,654

(22) Filed: Jul. 27, 2005

(65) Prior Publication Data

US 2005/0269574 A1    Dec. 8, 2005

Related U.S. Application Data

(62) Division of application No. 10/029,101, filed on Dec. 20, 2001, now Pat. No. 6,955,978.

(51) Int. Cl.
*H01L 21/02* (2006.01)

(52) U.S. Cl. .................. 257/77; 257/734; 257/771; 257/E21.062; 257/E21.504; 257/E29.104

(58) Field of Classification Search .............. 257/77
See application file for complete search history.

(56) References Cited

U.S. PATENT DOCUMENTS

| | | | | |
|---|---|---|---|---|
| 3,982,262 | A * | 9/1976 | Karatsjuba et al. ............ | 257/77 |
| 5,030,580 | A * | 7/1991 | Furukawa et al. ............ | 438/508 |
| 5,264,713 | A * | 11/1993 | Palmour ..................... | 257/77 |
| 5,323,022 | A * | 6/1994 | Glass et al. .................. | 257/77 |
| 5,416,342 | A * | 5/1995 | Edmond et al. ............... | 257/76 |
| 5,661,312 | A * | 8/1997 | Weitzel et al. ................ | 257/77 |
| 6,627,964 | B2 * | 9/2003 | Nakashima et al. ......... | 257/414 |
| 6,822,275 | B2 * | 11/2004 | Harada et al. ............... | 257/256 |
| 7,132,701 | B1 * | 11/2006 | Kordesch et al. ............ | 257/198 |

OTHER PUBLICATIONS

"Inteface Chemistry and Electrical Properties of Annealed Ni and Ni/Al-6H SiC Structures," C. Halling, R. Yakomova, V. Krastev, Ts. Marinova and E. Janzen, Inst. Phys. Conf. Seri No. 196, 1996 IOP Publishing Ltd.

"The Influence of Dry Cleaning Techniques on Thermal dxides Grown on 4H and 6J P-type Sic," C.M. Zet4erling, C.I. Harris, M. Ostling and V.V. Afanas'ev, Inst. Phys. Conf. Seri No. 196, 1996 IOP Publishing Ltd.

"Specific Contact Resistance as a Function of Doping N-type 4H and 6H-SiC," Inst. Phys. Cof. Seri No. 196 1996 IOP Publishing Ltd.

"Aluminum Doped 6H SiC: CVD Growth and Formation of Ohmici Contacts," 1st. Phys. Conf. Seri No. 196, 1996 IOP Publishing Ltd.

\* cited by examiner

*Primary Examiner*—Jerome Jackson
*Assistant Examiner*—Jose R Diaz
(74) *Attorney, Agent, or Firm*—Hiscock & Barclay, LLP; Thomas R. FitzGerald, Esq.

(57) ABSTRACT

A semiconductor device can comprise a contact material in substantially continuous contact with a contact region. In an embodiment the contact region may comprise an alloy comprising a wide band-gap material and a low melting point contact material. A wide band-gap material may comprise silicon carbide and a low melting point contact material may comprise aluminum. In another embodiment a substantially uniform ohmic contact may be formed between a contact material and a semiconductor material by annealing the contact at a temperature less than the melting point of the contact material. In an embodiment, the contact may be annealed for more than five hours.

21 Claims, 5 Drawing Sheets

UNIFORM CONTACT

CROSS-REFERENCE TO RELATED APPLICATIONS

This is a divisional application of U.S. patent application Ser. No. 10/029,101 filed Dec. 20, 2001 now U.S. Pat. No. 6,955,978.

FIELD OF THE INVENTION

The present invention relates to methods of making semiconductor devices and in particular to methods of providing ohmic contacts to wide band-gap layers utilized in a semiconductor device.

DESCRIPTION OF THE RELATED ART

Semiconductor devices are well known and widely used for many applications. The vast majority of semiconductor devices are fabricated from silicon because of the relative ease with which it may be processed to yield various electrical components and structures such as ohmic contacts to metal. Silicon semiconductor devices, however, have limitations regarding acceptable operating temperatures and power handling capability. In order to overcome these limitations, semiconductor devices can be fabricated from wide band-gap materials, such as silicon carbide, and may operate at substantially higher temperatures and power levels. Wide band-gap semiconductor devices have yet to achieve widespread commercial success, though, because of complexities in processing and in particular difficulties in creating low resistance, ohmic contacts to wide band-gap layers.

Electrical contact to wide band-gap layers may be fabricated by forming a contact material directly on a wide band-gap layer. In order to create an ohmic contact, metal contact layers formed directly on wide band-gap layers generally must be processed further at extremely high temperatures, 1000 degrees C. for example. When contact metals such as aluminum are subjected to these conditions, the contact metal 14 tends to melt and ball or otherwise separate from the high band-gap layer as shown in FIG. 1. These mechanisms severely reduce the quality and reproducibility of the contact due to varying contact areas 16 resulting from gaps 18 in the contact layer 14 and thus limits contact utility. FIG. 2 shows a top view of a contact layer 14 with gaps 18. Another problem arising with the formation of a contact directly on a wide band-gap material is spiking, particularly when contact is made to thin layers of wide band-gap material. As shown in FIG. 1, spiking can create an electrical short when the contact region 16 extends entirely through a layer of wide band-gap material 12 to an underlying substrate 10.

Barrier layers between the contact metal and wide band-gap material have been used to prevent spiking of the wide band-gap material by the contact material during annealing processes. However, these layers add additional processing steps and generally increase the resistivity of the electrical connection between the contact and wide band-gap material. Also, if an annealing step is required to create an ohmic contact between the contact metal and the barrier layer, problems regarding the melting and separation of the contact metal still exist and reduce the contact quality.

SUMMARY OF INVENTION

In embodiments described below, the process may overcome the problems above by enabling the manufacture of uniform ohmic electrical contacts between SiC and a low melting point material using conventional semiconductor processes. Ohmic contacts may be produced using longer, low temperature anneals and newer processing stages than prior techniques.

In one set of embodiments, the semiconductor device can comprise a silicon carbide region having a contact area. In one specific embodiment, the silicon carbide region may comprise p-type silicon carbide. The contact area may comprise a substantially uniform and continuous contact region throughout the contact area. The contact region can comprise an aluminum-silicon carbide alloy. A low melting point contact material may be in direct and substantially continuous contact with the contact region. The low melting point contact material may have a melting point at or below approximately 700 degrees Celsius. Electrical contact between the contact material and SiC region may be ohmic.

In another set of embodiments, the process for forming an electrical connection to a semiconductor device can comprise forming an exposed region that includes silicon carbide. The process can also comprise forming a first metal-containing layer that contacts the exposed region. The first metal-containing layer may comprise a composition that does not form an ohmic contact with a doped silicon carbide if annealed for a time period of less than five hours and at a temperature less than the melting point of a material within the metal-containing layer. The process may further comprise annealing the metal-containing layer and exposed region until a substantially continuous ohmic contact region is formed between the first metal-containing layer and the silicon carbide.

In another set of embodiments, a process for forming an electrical connection to a semiconductor device can comprise forming an exposed region that includes silicon carbide. The process can also comprise forming a metal-containing layer that contacts the exposed region. The process may further comprise annealing the metal-containing layer and exposed region for a time period of at least approximately ten hours and at a temperature of at least approximately 300 C.

The foregoing general description and the following detailed description are exemplary and explanatory only and are not restrictive of the invention as claimed.

BRIEF DESCRIPTION OF FIGURES

The present invention is illustrated by way of example and not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the present invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Described generally below is a process for forming an ohmic electrical contact between a contact layer and a silicon carbide layer. A non-ohmic contact may be annealed at a temperature less than the melting point of a material within the contact layer. Annealing may take more than two hours. An ohmic contact region can be substantially continuous and may not have discontinuities due to melting, balling, peeling, or other destructive mechanisms.

Figure 3:
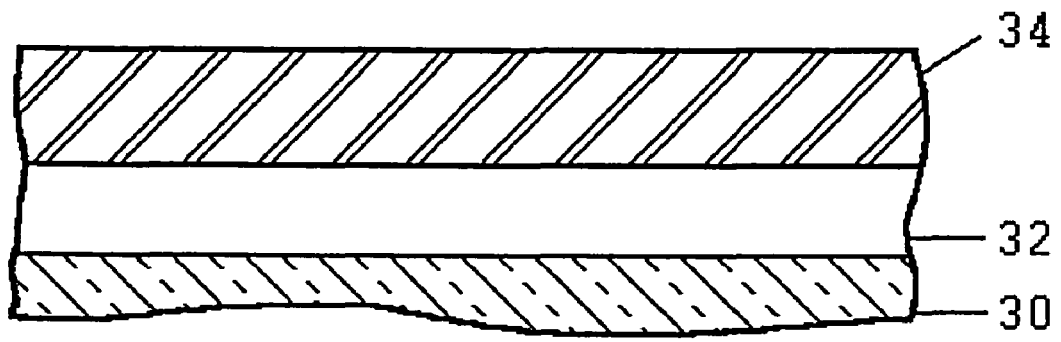
FIG. 3 includes an illustration of a cross-sectional view of a portion of a contact between a contact layer and a wide band-gap semiconductor material.

FIG. 3 illustrates a contact layer 34 formed over a large band gap semiconductor material 32 and an underlying substrate 30. The contact layer 34 may comprise a low melting point material that has a melting point less than approximately 700 degrees Celsius, such as aluminum, zinc, or the like. The contact layer 34 can comprise a substantially pure material or can comprise a material with impurities. Impurities in the contact layer 34 may comprise less than ten weight percent of the contact layer 34. The contact layer 34 can be formed through sputtering, chemical vapor deposition, or another conventional deposition processes and may generally be deposited to a thickness of approximately twenty percent of the thickness of the underlying wide band-gap semiconductor material 32. The contact layer 34 may form a rectifying or otherwise non-ohmic connection to the wide band-gap semiconductor 32 upon deposition and before performing any anneals.

A wide band-gap semiconductor material 32 may be any semiconductor with a band-gap greater than approximately two electron volts, such as silicon carbide. The wide band-gap semiconductor material 32 may comprise a P-type dopants such as boron, aluminum, or another similar dopants. The wide band-gap semiconductor thickness may be any thickness required by desired end product specification, but may generally fall within the range of approximately 0.1-100 microns, and more commonly in a range of approximately 0.1-4 microns. Material 32 may be the base in a transistor. The contact layer 34 and wide band-gap semiconductor 32 may be in direct and substantially continuous contact throughout the area over which the contact layer 34 is formed.

The portion of the underlying substrate 30 may comprise a wide band-gap semiconductor material. More particularly, the underlying substrate 30 may comprise silicon carbide and may comprise a dopants with a conductivity type opposite the conductivity type of the dopants of layer 32 such that a P-N or similar junction may be formed between substrate 30 and layer 32. Layer 30 may be a collector in a transistor.

Figure 4:
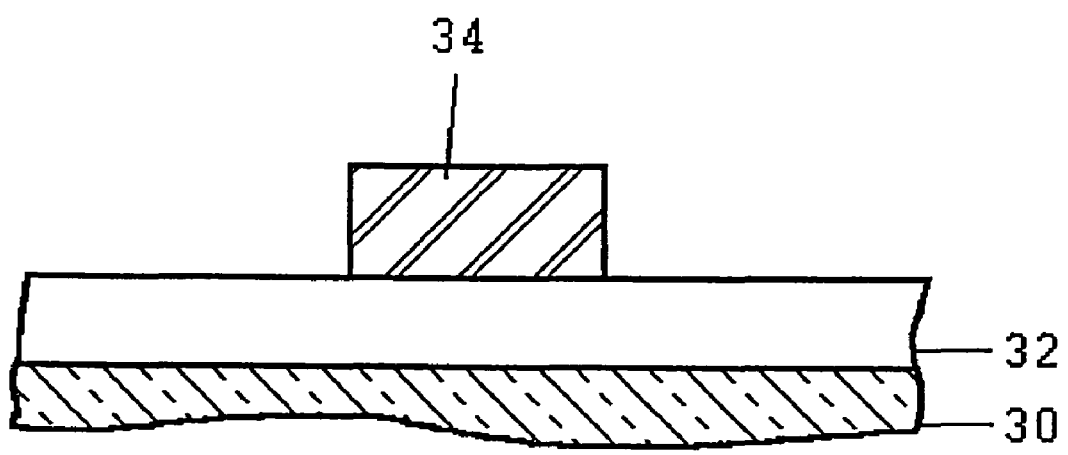
FIG. 4 includes an illustration of a cross-sectional view of a portion of the material of FIG. 3 after the contact layer has been etched.

The contact layer 34 can be used as a mask while etching the wide band-gap semiconductor material 32. As illustrated in FIG. 4, the contact layer 34 can be patterned and etched using conventional dry or wet methods to expose the underlying material. The contact layer 34 may be etched using common etchants, such as phosphoric acid or other similarly reactive chemicals. Features may be etched in the wide band-gap semiconductor material 32 using common methods, such as reactive ion etching with carbon tetrafluoride, sulfur hexafluoride, or other similarly reactive chemicals. The remaining portion of the contact layer 34 generally defines the contact area of the material 32 in this particular embodiment.

Figure 5:
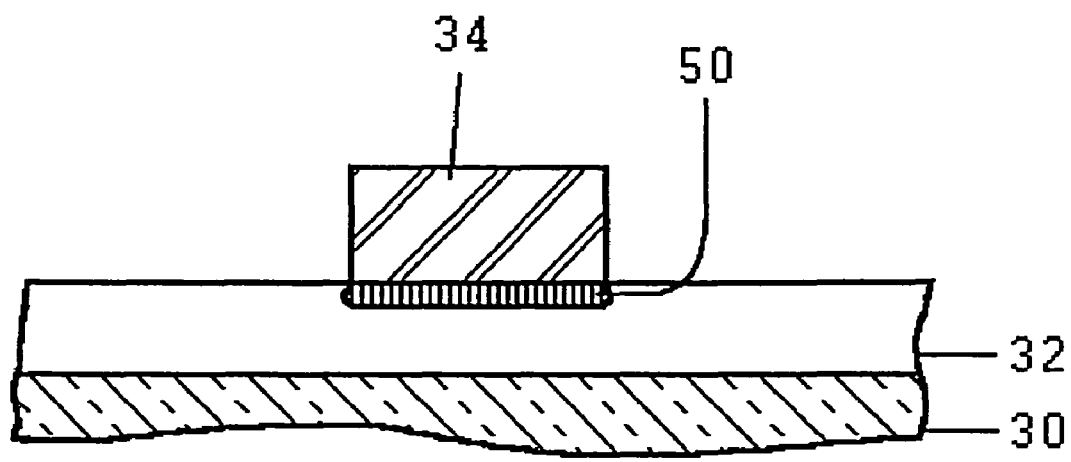
FIG. 5 includes an illustration of a cross-sectional view of a portion of the material of FIG. 4 after annealing has formed contact regions between the contact layer and wide band-gap semiconductor.

The contact layer 34 and wide band-gap semiconductor material 32 may be annealed to form a contact region 50 as illustrated in FIG. 5. Annealing may be performed at a temperature lower than the melting point of the contact layer 34, for example less than approximately 700 degrees Celsius and generally in the range of approximately 400-660 degrees Celsius. Annealing may be accomplished by maintaining the contact layer 34 and wide band-gap semiconductor material 32 at a selected annealing temperature for a duration of time sufficient to yield a contact region 50 with ohmic properties. For example, the time period may be more than approximately ten hours and may generally be in the range of approximately 25-60 hours. Annealing may be performed in an atmosphere comprising a substantially inert or noble gas, such as argon, or in a vacuum.

Figure 1:
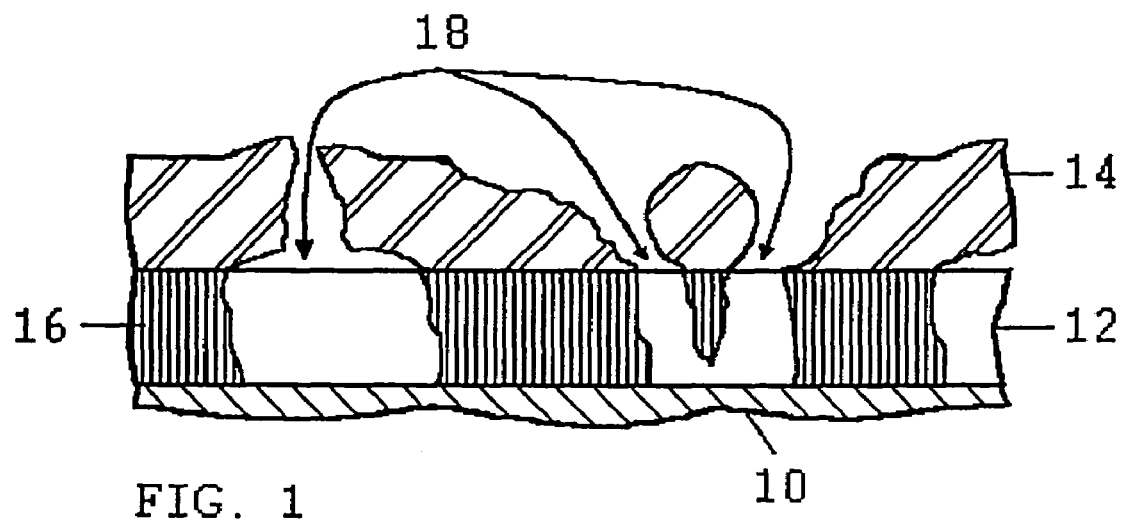
FIG. 1 includes an illustration of a cross-sectional view of a portion of a prior art contact where a high temperature anneal has caused the contact layer to melt resulting in discontinuities in the contact region.
Figure 2:
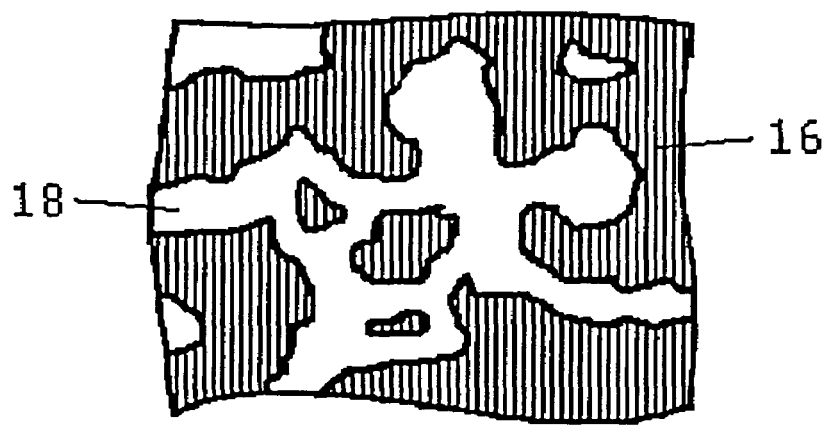
FIG. 2 includes an illustration of a top view of a portion of the prior art contact of FIG. 1.

The contact region 50 may comprise an alloy of the contact layer 34 and wide band-gap semiconductor material 32 and form a substantially ohmic connection to be made between the material 32 and the contact layer 34 as shown in FIG. 5. Compare to FIG. 1 in which a contact layer 12 has suffered from balling, melting, and peeling as may happen when annealed at temperatures above the melting point of the contact layer 12. Unlike FIG. 1, the contact region 30 of the embodiment as illustrated in FIG. 5 may be substantially continuous and free of significant discontinuities 18 due to peeling, balling, melting, or other mechanisms that could affect the contact layer 34 during annealing. Additionally, the contact region 50 may not extend entirely through the wide band-gap semiconductor 32 to underlying layer 30, causing an electrical short.

Figure 6:
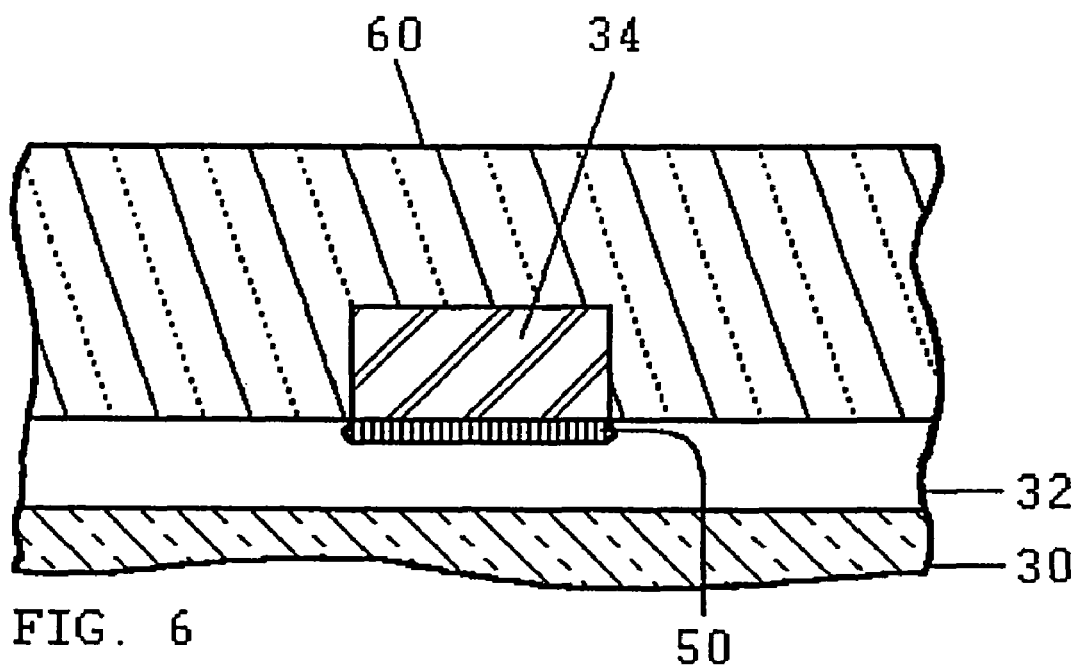
FIG. 6 includes an illustration of a cross-sectional view of a portion of the material of FIG. 5 after forming an insulating layer over the contact layer and wide band-gap semiconductor material.
Figure 7:
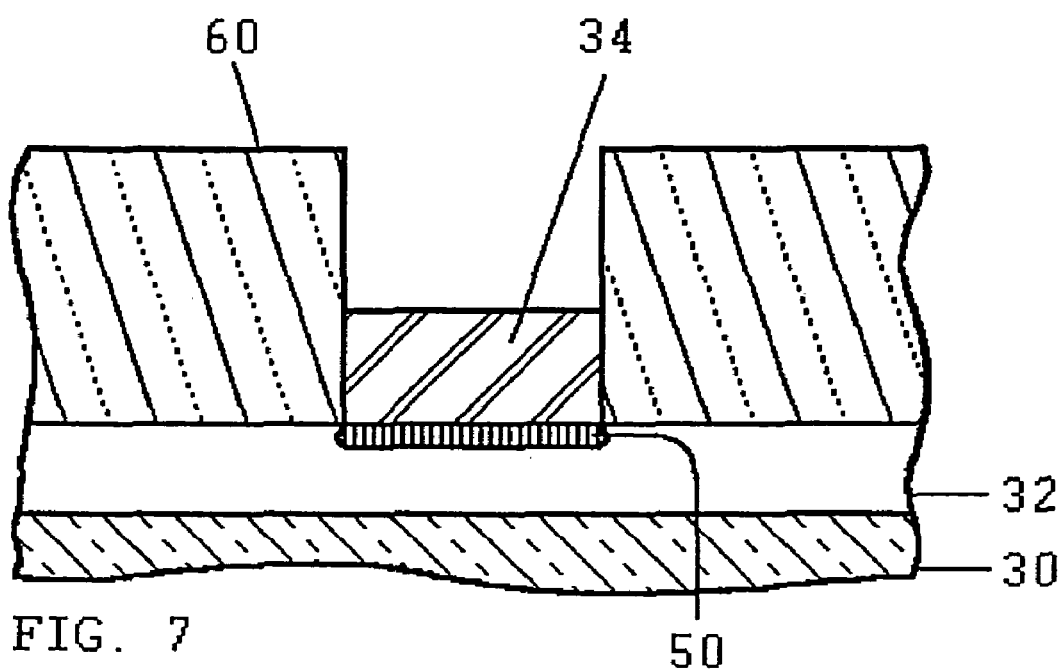
FIG. 7 includes an enlarged illustration of a cross-sectional view of the material of FIG. 6 after etching a portion of the insulating layer to expose portions of the contact layer.
Figure 8:
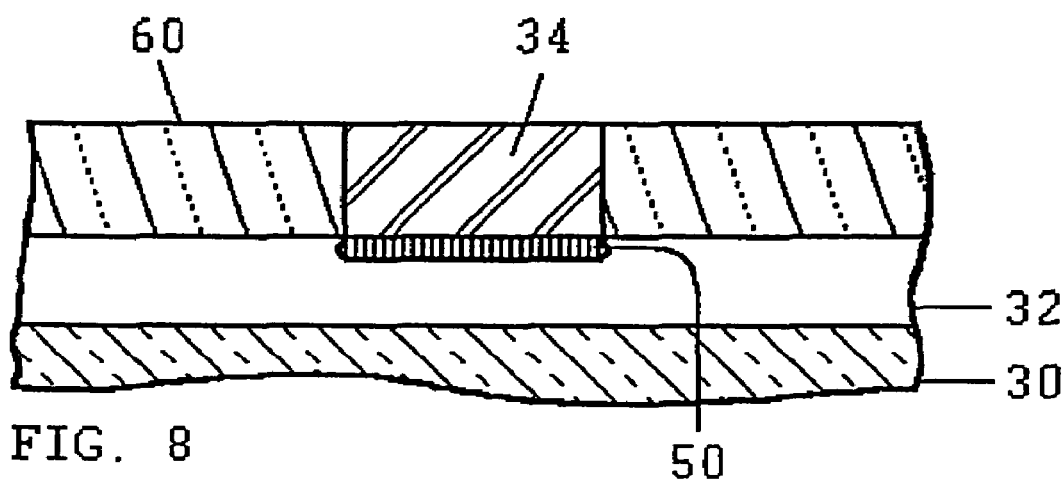
FIG. 8 includes an illustration of a cross-sectional view of a portion of the material of FIG. 7 where portions of the insulating layer have been removed to expose the contact region.

An insulating material 60 may be formed over the exposed contact region 50, wide band-gap semiconductor 32, and contact layer 34, as illustrated in FIG. 6. The insulating material 60 may comprise an insulator such as silicon dioxide, silicon nitride, or another similar insulating material. Insulating material 60 can be formed using conventional processes including sputter deposition or chemical vapor deposition. The insulating material 60 may be deposited to a thickness greater than that of the contact layer 34, and may generally be between approximately 0.5-20 microns thick. Portions of the insulating material 60 can be removed to expose underlying portions of the contact layer 34, as shown in FIG. 7. The insulating material may be removed via common etch processes using hydrofluoric acid or another similar etchant. Mechanical removal such as polishing may be employed to form a planar structure as shown in FIG. 8.

Figure 9:
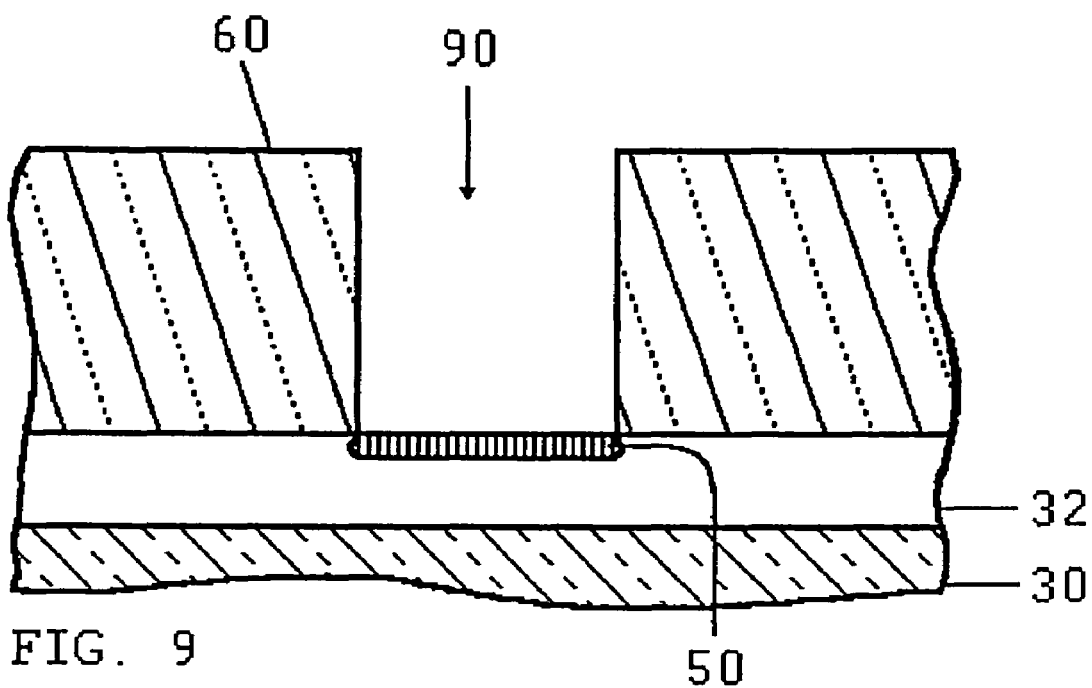
FIG. 9 includes an illustration of a cross-sectional view of a portion of the device of FIG. 8 after removing the contact layer.
Figure 10:
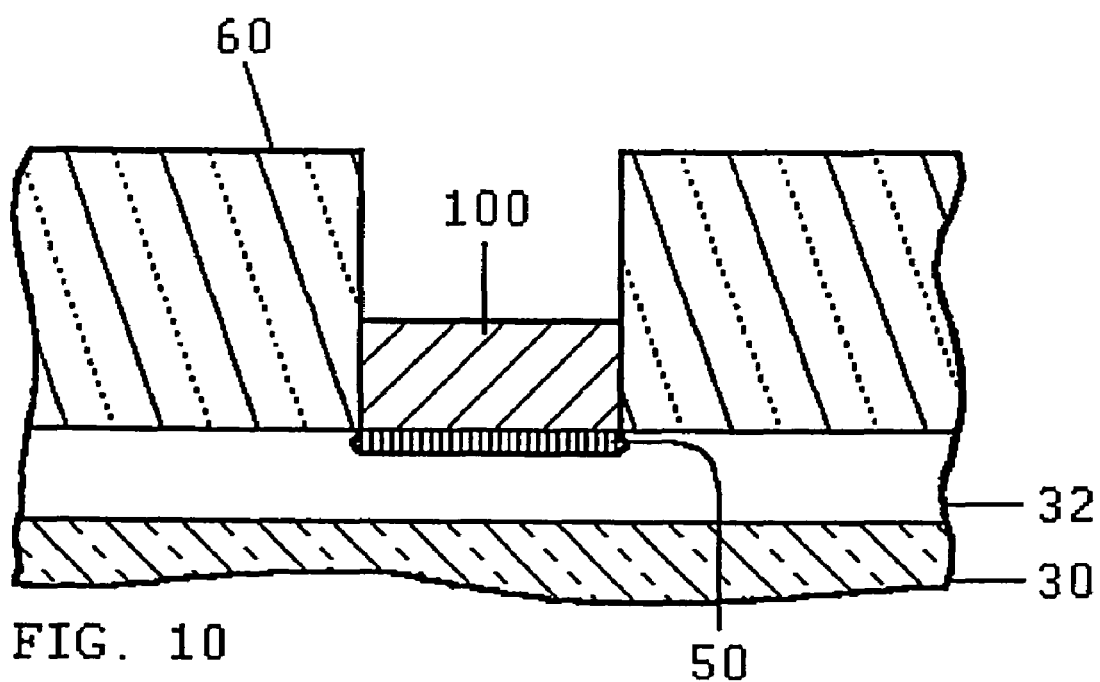
FIG. 10 includes an illustration of a cross-sectional view of a portion of the device FIG. 9 after forming a second contact layer.

Illustrated in FIG. 9, the contact layer 34 may be substantially entirely removed to expose the contact region 50 by etching with phosphoric acid or another similar etchant. A second contact layer 100, shown in FIG. 10, may be formed at least partially within the openings 90 and in contact with the contact region 50. The second contact layer 100 may comprise the same material as the first contact layer and may form a substantially ohmic electrical connection to the silicon carbide region 32. The second contact layer can be formed through sputtering or other common deposition methods, and may have a thickness in the range of approximately 0.5-20 microns.

A substantially complete electrical device, such as a diode or transistor, may be formed by connecting wires, leads, or other similar apparatus (not shown) to the exposed contact layer 34 portions. For example, an emitter region (not shown) could be formed over or from a portion of material 32. Wires, leads, or other apparatus can be bonded, soldered, or otherwise electrically connected to the exposed contact layer 34 portions.

Accordingly, devices produced can exhibit lower contact resistance due to the substantially continuous contact region. Lower contact resistance can result in faster and more efficient and reliable operation of devices. Production costs for these devices may also be reduced due to the greater reproducibility and yields that can be realized with the uniform contact region. Devices produced accordingly do not require barrier layers or thick semiconductor layers to prevent spiking.

In the foregoing specification, the invention has been described with reference to specific embodiments. However, after reading this specification, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and any element(s) that may cause any benefit, advantage, or solution to occur or become more pronounced are not to be construed as a critical, required or essential feature or element of any or all the claims.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. In one example, a condition A or B is satisfied by any one of the following: A is true (or present) and B is false (or not present), A is false (or not present) and B is true (or present), and both A and B are true (or present).

What is claimed is:

1. A semiconductor device comprising:
   a silicon carbide region of a width between 0.1 and 100 μm having a contact area;
   a substantially uniform and continuous contact region throughout the contact area, the contact region extending into the silicon carbide region; and
   a low melting point contact material in direct and substantially continuous contact with the contact region;
   wherein the silicon carbide region is of an opposite conductivity type to any silicon carbide in contact with the silicon carbide region.

2. The semiconductor device of claim 1, wherein the low melting point contact material has a melting point at or below approximately 700 degrees Celsius.

3. The semiconductor device of claim 1, wherein the silicon carbide region comprises p-type silicon carbide.

4. The semiconductor device of claim 1, wherein the contact region comprises an aluminum-silicon carbide alloy.

5. The semiconductor device of claim 1, wherein the contact material comprises substantially pure aluminum.

6. The semiconductor device of claim 1, wherein the contact between the silicon carbide region and the contact material is ohmic.

7. The semiconductor device of claim 1, wherein the silicon carbide region is the base of a transistor.

8. A semiconductor device comprising:
   a substrate;
   a first silicon carbide layer of a first conductivity type having a first surface and a second surface on opposites sides of said first silicon carbide layer;
   a second silicon carbide layer of a second conductivity type opposite to said first conductivity type in contact with said first surface;
   a low melting point contact material in direct and substantially continuous and substantially uniform contact with said second surface at a contact region, said contact region extending into said contact material and said second surface.

9. The semiconductor device of claim 8, wherein the low melting point contact material has a melting point at or below approximately 700 degrees Celsius.

10. The semiconductor device of claim 8, wherein the silicon carbide region comprises p-type silicon carbide.

11. The semiconductor device of claim 8, wherein the contact region comprises an aluminum-silicon carbide alloy.

12. The semiconductor device of claim 8, wherein the contact material comprises substantially pure aluminum.

13. The semiconductor device of claim 8, wherein the contact between the silicon carbide region and the contact material is ohmic.

14. The semiconductor device of claim 1, wherein the silicon carbide region is the base of a transistor.

15. A semiconductor device comprising;
   a substrate;
   a silicon carbide region;
   a contact region which extends into the silicon carbide region and into a low melting point contact material such that there is a direct and substantially continuous and substantially uniform contact between the silicon carbide region and the contact material;
   wherein the silicon carbide region is of an opposite conductivity type to any silicon carbide in contact with the silicon carbide region.

16. The semiconductor device of claim 15, wherein the low melting point contact material has a melting point at or below approximately 700 degrees Celsius.

17. The semiconductor device of claim 15, wherein the silicon carbide region comprises p-type silicon carbide.

18. The semiconductor device of claim 15, wherein the contact region comprises an aluminum-silicon carbide alloy.

19. The semiconductor device of claim 15, wherein the contact material comprises substantially pure aluminum.

20. The semiconductor device of claim 15, wherein the contact between the silicon carbide region and the contact material is ohmic.

21. The semiconductor device of claim 15, wherein the silicon carbide region is the base of a transistor.

* * * * *